US010644103B2

(12) United States Patent
Zhu et al.

(10) Patent No.: US 10,644,103 B2
(45) Date of Patent: *May 5, 2020

(54) SEMICONDUCTOR DEVICES HAVING CHARGED PUNCH-THROUGH STOPPER LAYER TO REDUCE PUNCH-THROUGH AND METHODS OF MANUFACTURING THE SAME

(71) Applicant: Institute of Microelectronics, Chinese Academy of Sciences, Beijing (CN)

(72) Inventors: Huilong Zhu, Poughkeepsie, NY (US); Xing Wei, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/296,448

(22) Filed: Oct. 18, 2016

(65) Prior Publication Data

US 2017/0133457 A1    May 11, 2017

(30) Foreign Application Priority Data

Nov. 5, 2015   (CN) .......................... 2015 1 0746553

(51) Int. Cl.
*H01L 29/06* (2006.01)
*H01L 29/66* (2006.01)
*H01L 21/765* (2006.01)
*H01L 29/78* (2006.01)

(52) U.S. Cl.
CPC ........ *H01L 29/0638* (2013.01); *H01L 21/765* (2013.01); *H01L 29/66795* (2013.01); *H01L 29/7851* (2013.01)

(58) Field of Classification Search
CPC ..................................................... H01L 29/063
USPC ......................................................... 257/394
See application file for complete search history.

(56) References Cited

U.S. PATENT DOCUMENTS

| 9,312,183 | B1* | 4/2016 | Kim ............... H01L 21/823437 |
| 10,128,244 | B2* | 11/2018 | Zhu ................. H01L 21/823821 |
| 2004/0238914 | A1* | 12/2004 | Deshpande ......... H01L 21/3185 257/506 |
| 2015/0102424 | A1* | 4/2015 | Colinge ............. H01L 29/0649 257/394 |
| 2016/0181161 | A1* | 6/2016 | Song ................. H01L 29/66803 257/345 |
| 2017/0053825 | A1* | 2/2017 | Seo ................... H01L 21/31144 |

* cited by examiner

*Primary Examiner* — Shaun M Campbell
(74) *Attorney, Agent, or Firm* — Schwegman Lundberg & Woessner, P.A.

(57) ABSTRACT

Provided are a semiconductor device having a charged punch-through stopper (PTS) layer to reduce punch-through and a method of manufacturing the same. In an embodiment, the semiconductor device may include a fin structure formed on a substrate; an isolation layer formed on the substrate, wherein a portion of the fin structure above the isolation layer acts as a fin of the semiconductor device; a charged PTS layer formed on side walls of a portion of the fin structure beneath the fin; and a gate stack formed on the isolation layer and intersecting the fin. The semiconductor device may be an n-type device or a p-type device. For the n-type device, the PTS layer may have net negative charges, and for the p-type device, the PTS layer may have net positive charges.

14 Claims, 9 Drawing Sheets

US 10,644,103 B2

SEMICONDUCTOR DEVICES HAVING CHARGED PUNCH-THROUGH STOPPER LAYER TO REDUCE PUNCH-THROUGH AND METHODS OF MANUFACTURING THE SAME

CROSS-REFERENCE TO RELATED APPLICATION

This application claims priority to Chinese Patent Application No. 201510746553.6, filed on Nov. 5, 2015, entitled "semiconductor devices having charged punch-through stopper layer to reduce punch-through and methods of manufacturing the same," which is incorporated herein by reference in its entirety.

TECHNICAL FIELD

The present disclosure relates to the semiconductor technology, and particularly to semiconductor devices having a charged punch-through stopper (PTS) layer to reduce punch-through and methods of manufacturing the same.

BACKGROUND

Short channel effects are getting more significant as planar semiconductor devices are increasingly being scaled down. To this end, three-dimensional (3D) semiconductor devices, such as Fin Field Effect Transistors (FinFETs), have been proposed. Generally, a FinFET includes a fin formed vertically on a substrate and a gate stack intersecting the fin.

Particularly, in a bulk FinFET (i.e., a FinFET formed on a bulk semiconductor substrate, which has a fin formed from the bulk semiconductor substrate and thus physically connected to the bulk semiconductor substrate), there may be leakage between source and drain regions via a portion of the substrate beneath the fin (or a sub-fin portion), which is also referred to as punch-through. Generally, a punch-through stopper (PTS) layer may be formed (beneath the fin) by ion implantation and/or thermal diffusion. An ideal PTS layer should not introduce dopants into the fin, while enabling the sub-fin portion to fully deplete.

However, it is difficult in the art to form a PTS layer having an abrupt distribution (i.e., from a nearly zero dopant concentration in the fin to a high-dopant concentration in the sub-fin portion).

SUMMARY OF THE DISCLOSURE

In view of the above, the present disclosure aims to provide, among others, a semiconductor device having a novel punch-through stopper (PTS) layer structure and a method of manufacturing the same.

According to an aspect of the present disclosure, there is provided an n-type semiconductor device, comprising: a fin structure formed on a substrate; an isolation layer formed on the substrate, wherein a portion of the fin structure above the isolation layer acts as a fin of the semiconductor device; a charged PTS layer formed on side walls of a portion of the fin structure beneath the fin; and a gate stack formed on the isolation layer and intersecting the fin, wherein the PTS layer has net negative charges.

According to another aspect of the present disclosure, there is provided a p-type semiconductor device, comprising: a fin structure formed on a substrate; an isolation layer formed on the substrate, wherein a portion of the fin structure above the isolation layer acts as a fin of the semiconductor device; a charged PTS layer formed on side walls of a portion of the fin structure beneath the fin; and a gate stack formed on the isolation layer and intersecting the fin, wherein the PTS layer has net positive charges.

According to another aspect of the present disclosure, there is provided a method of manufacturing an n-type semiconductor device, comprising: patterning a substrate to form a fin structure; forming a charged PTS layer on side walls of the fin structure; forming an isolation layer on the PTS layer, wherein a portion of the fin structure which is exposed by the isolation layer acts as a fin of the semiconductor device; selectively removing a portion of the PTS layer which is exposed by the isolation layer, while a portion of the PTS layer on side walls of a portion of the fin structure beneath the fin is remained; and forming a gate stack intersecting the fin on the isolation layer, wherein the PTS layer has net negative charges.

According to another aspect of the present disclosure, there is provided a method of manufacturing a p-type semiconductor device, comprising: patterning a substrate to form a fin structure; forming a charged PTS layer on side walls of the fin structure; forming an isolation layer on the PTS layer, wherein a portion of the fin structure which is exposed by the isolation layer acts as a fin of the semiconductor device; selectively removing a portion of the PTS layer which is exposed by the isolation layer, while a portion of the PTS layer on side walls of a portion of the fin structure beneath the fin is remained; and forming a gate stack intersecting the fin on the isolation layer, wherein the PTS layer has net positive charges.

According to another aspect of the present disclosure, there is provided an electronic device, comprising an integrated circuit formed from the semiconductor device as described above.

According to another aspect of the present disclosure, there is provided a method of manufacturing a System on Chip (SoC), comprising the method as described above.

According to embodiments of the present disclosure, the charged PTS layer is formed on the side walls of the portion of the fin structure beneath the fin (or sub-fin). The PTS layer may introduce electrons or holes into the sub-fin, and thus increase electrical potential energy of holes (for a p-type device) or electrons (for an n-type device) in the sub-fin, i.e., forming a potential barrier in the sub-fin. As a result, the PTS layer can suppress leakage current between source and drain regions via the sub-fin.

Due to the suppression of the punch-through effect by the PTS layer, there may be a distance between a top surface of a well formed in the substrate and the bottom of the fin. As a result, dopants in the well can have less influence on the fin, thereby reducing random dopant fluctuation and variation in threshold voltage.

BRIEF DESCRIPTION OF THE DRAWINGS

The above and other objects, features, and advantages of the present disclosure will become apparent from following descriptions of embodiments with reference to the attached drawings, in which.

Throughout the attached drawings, like reference signs denote like parts.

DETAILED DESCRIPTION

Figure 1:
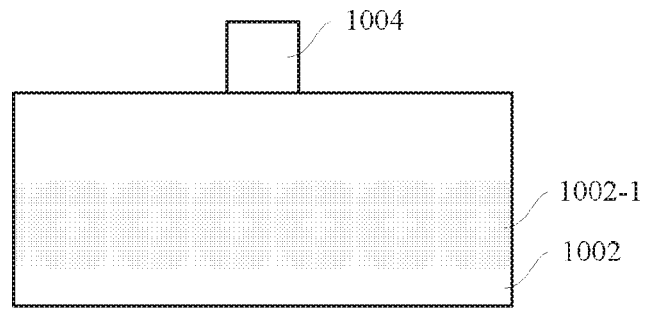
FIGS. 1 to 11C are views illustrating a flow of manufacturing a semiconductor device according to an embodiment of the present disclosure.

Hereinafter, the technology disclosed herein is described with reference to embodiments thereof shown in the attached drawings. However, it should be noted that those descriptions are provided for illustrative purpose only, rather than limiting the present disclosure. Further, in the following, descriptions of known structures and techniques might be omitted so as not to obscure the concept of the present disclosure.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances or technique limitations in practice. Those skilled in the art can also devise regions/layers of different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

According to an embodiment of the present disclosure, there is provided a fin-based semiconductor device (for example, a FinFET, and in particular, a bulk FinFET), either an n-type device or a p-type device. The semiconductor device may comprise a fin structure formed on a substrate, and a fin of the device may be defined from the fin structure by an isolation layer formed on the substrate. In particular, the isolation layer is formed on the substrate to expose a portion of the fin structure, i.e., the isolation layer is formed on the substrate on opposite sides of the fin structure. The portion of the fin structure which is exposed by the isolation layer (i.e., a portion of the fin structure which is above the isolation layer or in particular, above a top surface of the isolation layer) may act as the fin of the device. A gate dielectric layer and a gate electrode layer are then formed on the fin. In particular, a gate stack comprising the gate dielectric layer and the gate electrode layer stacked on each other may be formed to intersect the fin.

A portion of the fin structure beneath the fin (or a sub-fin portion) is surrounded by the isolation layer, and thus cannot be effectively controlled by the gate stack. Thereby, there may be a leakage current via this portion between source and drain regions, i.e., punch-through. According to an embodiment of the present disclosure, a charged punch-through stopper (PTS) layer is formed on side walls of this portion. For an n-type semiconductor device, the PTS layer may have net negative charges, and for a p-type semiconductor device, the PTS layer may have net positive charges. The PTS layer may introduce electrons or holes into the sub-fin, and thus increase electrical potential energy of holes (for the p-type device) or electrons (for the n-type device) in the sub-fin, i.e., forming a potential barrier in this portion. As a result, the PTS layer can suppress the leakage current via the sub-fin between the source and the drain.

The PTS layer may be an insulator, so that charges therein are not mobile.

The PTS layer may have a single-layer or multi-layer structure. For example, the PTS layer may comprise a stack of a dielectric layer/a charged layer/a dielectric layer. The charged layer may comprise a conductor or a dielectric.

The present disclosure may be presented in various forms, and some examples thereof will be described hereafter.

FIGS. 1 to 11 are views illustrating a flow of manufacturing a semiconductor device according to an embodiment of the present disclosure.

As shown in FIG. 1, a substrate 1002 is provided. The substrate 1002 may comprise any suitable substrate in various forms, for example, but not limited to, a bulk semiconductor substrate, such as a bulk Si substrate, a Semiconductor On Insulator (SOI) substrate, a compound semiconductor substrate such as a SiGe substrate or the like. In the following, a bulk Si substrate is described by way of example for convenience of description.

A well 1002-1 may be formed in the substrate 1002. In particular, an n-type well may be formed, so that a p-type device may be formed later therein; or a p-type well may be formed, so that an n-type device may be formed later therein. For example, the n-type well may be formed by implanting n-type impurities (such as P or As) into the substrate 1002, and the p-type well may be formed by implanting p-type impurities (such as B or In) into the substrate 1002. If required, annealing may be performed after the implantation. There are various ways in the art to form the n-type or p-type wells, and detailed descriptions thereof will be omitted here.

Figure 2:
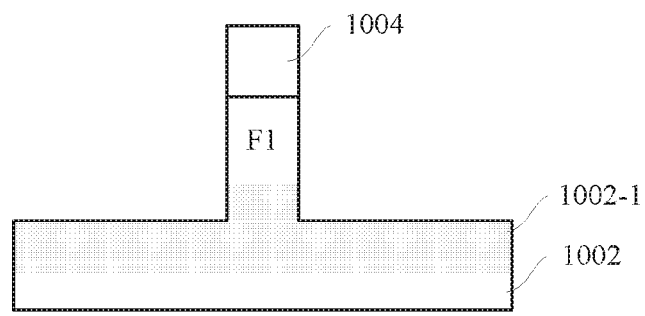

The substrate 1002 may be then patterned to form a fin structure. For example, this can be done as follows. In particular, a mask layer 1004 such as photoresist may be formed on the substrate 1002 and patterned into a shape corresponding to the fin structure to be formed, for example, a bar shape (extending perpendicularly to the sheet). Then, as shown in FIG. 2, the substrate 1002 may be selectively etched by, for example, Reactive Ion Etching (RIE), with the mask layer 1004 as a mask, thereby forming the fin structure F1. The formed fin structure F1 has a width (i.e., a dimension in a horizontal direction in the figure) of about 2-25 nm. As described below, an upper portion of the fin structure F1 (in particular, a portion which is exposed by an isolation layer) acts as a fin of the device. Here, the etching may be performed into the well 1002-1, and thus the fin structure F1 can include a part of the well. Then, the mask layer 1004 may be removed.

Then, a charged PTS layer may be formed on side walls of a lower portion of the fin structure. In order to ensure that the PTS layer is formed on side walls of a sub-fin portion of the fin structure, forming of the PTS layer may be performed together with forming of the isolation layer, For example, this can be done as follows.

Figure 3:
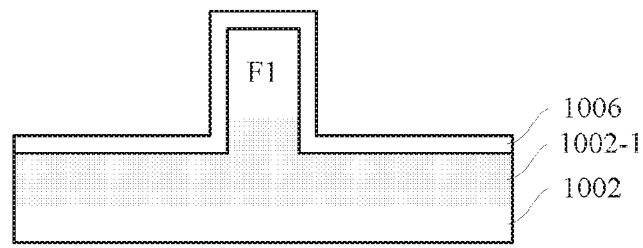

In particular, as shown in FIG. 3, a dielectric layer 1006 may be formed on the substrate 1002 with the fin structure F1 formed thereon through, for example, deposition. For example, the dielectric layer 1006 may comprise nitride (for example, silicon nitride), a carbon-containing layer, or a high-K layer such as $HfO_2$, with a thickness of about 0.5-10 nm. The dielectric layer 1006 may be charged by plasma treatment. In particular, surface plasma treatment (for example, being limited to the surface, for example, within about 1-2 nm from the surface) may be performed. The plasma bombards a surface of the dielectric layer to cause defects in the dielectric layer. Such defects may have negative charges or positive charges. If an n-type device is to be formed, the dielectric layer 1006 may have net negative charges; or if a p-type device is to be formed, the dielectric layer 1006 may have net positive charges. In the dielectric layer 1006, the net charges may have a dosage of about $10^{11}$-$10^{14}$ cm$^{-2}$. As the dielectric layer 1006 is an insulator, the charges therein are not mobile, and thus will not move into the fin structure F1.

Figure 4:
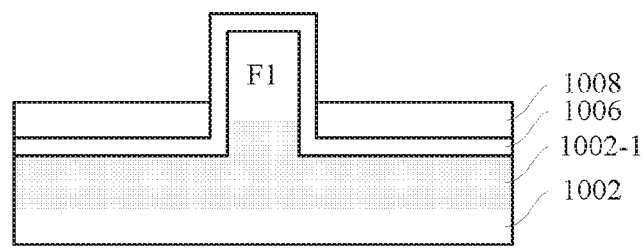

Next, as shown in FIG. 4, an isolation layer 1008 may be formed on the structure illustrated in FIG. 3. For example, the isolation layer 1008 may be formed by depositing and then etching back a dielectric material such as oxide (for example, silicon oxide) on the structure illustrated in FIG. 3. Before the back-etching, the deposited dielectric material may be planarized by, for example, Chemical Mechanical Polishing (CMP) or sputtering. In the back-etching process, a back-etching depth is controlled so that a top surface of the isolation layer 1008 after being etched back is recessed relative to a top surface of the fin structure F1. In this way, a portion of the fin structure F1 which protrudes relative to the isolation layer 1008 may then act as the fin F of the device, as shown in FIG. 5.

Figure 5:
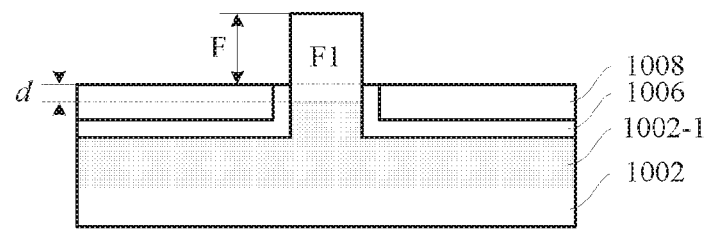

Thereafter, as shown in FIG. 5, the charged dielectric layer 1006 may be selectively etched (for example, by hot phosphoric acid in the case of the nitride). Due to the selective etching, a portion of the dielectric layer 1006 which is covered by the isolation layer 1008 can be remained, so that a top surface of the dielectric layer 1006 may be substantially flush with the top surface of the isolation layer 1008. Therefore, the dielectric layer 1006 is located beneath the fin F without extending onto the side walls of the fin F (i.e., without extending beyond the top surface of the isolation layer). In this example, the dielectric layer 1006 comprises a portion extending on side walls of the portion of the fin structure F1 beneath the fin F and also a portion extending along a surface of the substrate 1002.

It is to be noted that the fin structure F1 is only functionally divided into the portion acting as the fin F and the sub-fin portion beneath the fin F (in particular, the fin has a channel formed on the side walls thereof and optionally on the top surface thereof, and the sub-fin portion does not have a channel formed thereon), but those portions are physically integral with each other. In the following illustrations, such division is illustrated by a dotted line. However, it is merely used to facilitate readers to better understand the technology of the present disclosure, instead of limiting the present disclosure.

The charges in the dielectric layer 1006 may introduce charges into the portion of the fin structure F1 beneath the fin F. In particular, the charged dielectric layer 1006 may change an electrical potential field in a corresponding portion of the fin structure F1 (i.e., the portion beneath the fin F). The electrical potential field may pull in/out electrons or holes generated by heat into/from the portion, so that the electrons or holes are accumulated in the portion of the fin structure. For example, if the dielectric layer 1006 has net positive charges (for a p-type device), electrons may be introduced into the portion of the fin structure F1 beneath the fin F, thereby increasing the electrical potential energy of holes in the portion; and if the dielectric layer 1006 has net negative charges (for an n-type device), holes may be introduced into the portion of the fin structure F1 beneath the fin F, thereby increasing the electrical potential energy of electrons in the portion. In this way, the dielectric layer 1006 may form a potential barrier in the portion of the fin structure F1 beneath the fin F, thereby suppressing punch-through.

Here, the dielectric layer 1006 may also be referred to as "a PTS layer," although it is not formed in the fin structure as usual. Conventionally, a PTS layer is generally formed of a doped region beneath the fin.

Advantageously, the top surface of the well 1002-1 is lower than the bottom of the fin F (or the top surface of the isolation layer 1008) by a distance, as illustrated by d in FIG. 5. Although the distance d exists (a portion of the fin structure F1 which corresponds to the distance d may be substantially non-doped or lightly-doped), punch-through can be still suppressed by the charged PTS layer 1006, as described above. Further, due to the distance d it is possible to suppress diffusion of dopants in the well 1002-1 into the fin F, thereby reducing random dopant fluctuation and variation in threshold voltage.

After the fin and the PTS layer are formed as described above, subsequent processes may be performed to complete manufacturing of the device such as FinFET. It is to be understood by those skilled in the art that there are various ways to manufacture the FinFET, and only an exemple among them will be described below.

Figure 6A:
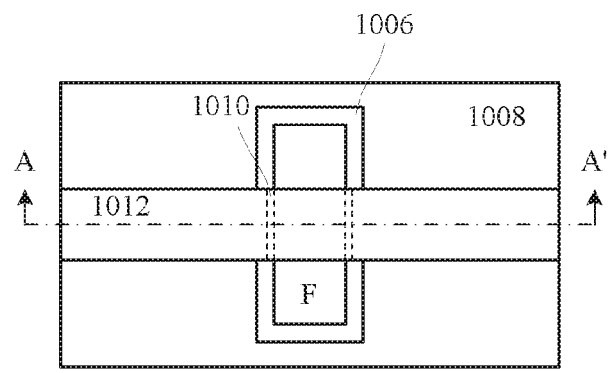
Figure 6B:
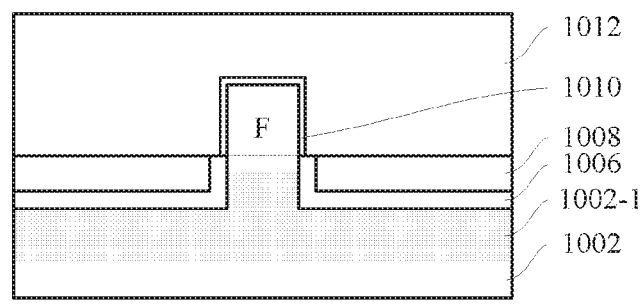

In particular, a gate stack intersecting the fin may be formed on the isolation layer 1008. For example, this may be done as follows. In particular, as shown in FIGS. 6(*a*) and 6(*b*) (FIG. 6(*b*) shows a cross-sectional view along line AA' in FIG. 6(*a*)), a sacrificial gate dielectric layer 1010 is formed through, for example, deposition. For example, the sacrificial gate dielectric layer 1010 may comprise oxide, oxynitride, or a stack of oxide/nitride, with a thickness of about 0.8-5 nm. Although the sacrificial gate dielectric layer 1010 is shown in the example of FIGS. 6(*a*) and 6(*b*) as having a shape of "Π" the sacrificial gate dielectric layer 1010 may also include a portion extending onto the top surface of the isolation layer 1008. Then, a sacrificial gate conductor layer 1012 is formed through, for example, deposition. The sacrificial gate conductor layer 1012 may comprise, for example, polysilicon. The sacrificial gate conductor layer 1012 may completely cover the fin, and may be planarized by, for example, Chemical Mechanical Polishing (CMP). Next, the sacrificial gate conductor layer 1012 is patterned to form a sacrificial gate stack. The sacrificial gate conductor layer 1012 is patterned into a bar intersecting (for example, perpendicular to) the fin in the example of FIGS. 6(*a*) and 6(*b*). In another embodiment, the sacrificial gate dielectric layer 1010 may be further patterned with the patterned sacrificial gate conductor layer 1012 as a mask. FIGS. 6(*a*) and 6(*b*) illustrate a resultant structure after the sacrificial gate dielectric layer 1010 is patterned.

After forming the sacrificial gate stack, halo implantation and extension implantation may be performed with the sacrificial gate stack as a mask, for example.

Figure 7A:
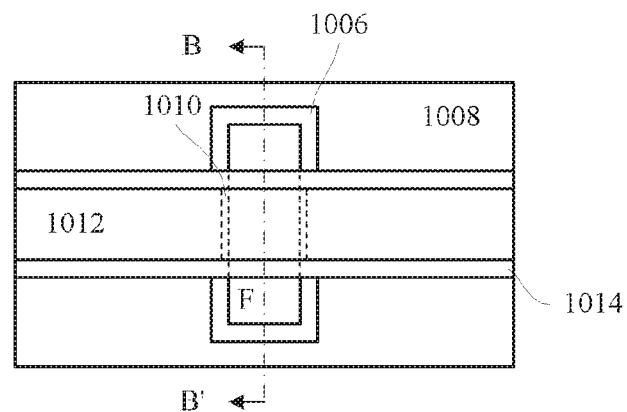
Figure 7B:
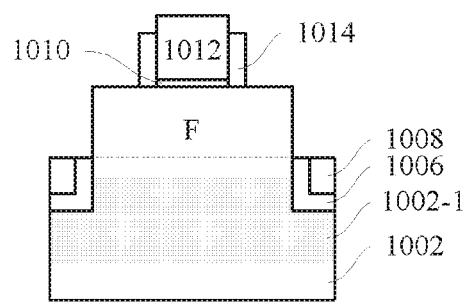

Next, as shown in FIGS. 7(*a*) and 7(*b*) (FIG. 7(*b*) shows a cross-sectional view along line BB' in FIG. 7(*a*)), a spacer 1014 may be formed on side walls of the sacrificial gate stack. The spacer 1014 may be formed by, for example, depositing a nitride layer with a thickness of about 5-20 nm, and then applying RIE on the nitride layer. It is to be understood by those skilled in the art that there are various ways to form such a spacer, and details thereof will be omitted here. The spacer 1020 may have substantially no portion thereof formed on the side walls of the fin F by controlling a height of the gate stack (for example, by forming the sacrificial gate conductor 1012 a relatively great height).

After forming the spacer, source/drain (S/D) implantation may be performed with the sacrificial gate stack and the spacer as a mask. Then, implanted ions may be activated through annealing to form source/drain regions.

Figure 8:
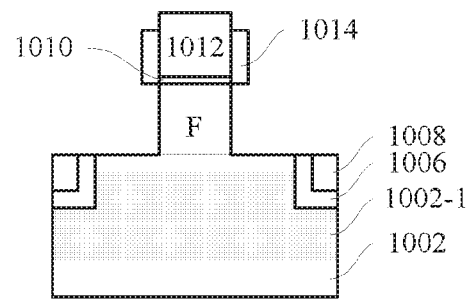
Figure 9:
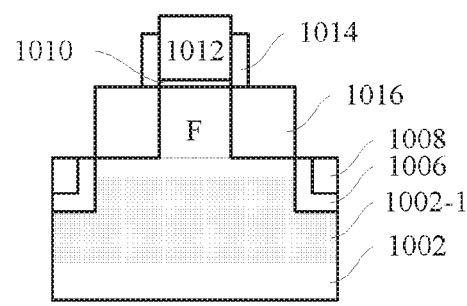

Here, the strained source/drain technology is applicable. Specifically, as shown in FIG. 8, the fin structure F1 is selectively etched (by, for example, a Tetramethylammonium hydroxide (TMAH) solution) so that the portion of the fin structure F1 which is exposed by the sacrificial gate stack and the spacer may be selectively removed. In the process of selectively removing the fin structure F1 (for example, Si), the sacrificial gate conductor layer 1012 (for example, polysilicon) may also be partly removed. Then, as shown in FIG. 9, a semiconductor layer 1016 may be selectively grown on the fin structure F1 by epitaxy. In the process of growing the semiconductor layer 1016, the semiconductor layer 1016 may be doped in-situ. For example, p-type doping may be performed for a p-type device, and n-type doping may be performed for an n-type device, so as to form a source region and a drain region of the device. The semiconductor layer 1016 may comprise a different material from that of the fin structure F1, so as to apply stress to the fin structure F1 (in particular, a channel formed in the fin). For example, the semiconductor layer 1016 may comprise Si:C (wherein C may have an atomic percentage of about 0.2-2%) to apply tensile stress (for an n-type device), or SiGe (wherein Ge may have an atomic percentage of about 15-75%) to apply compressive stress (for a p-type device).

Figure 10:
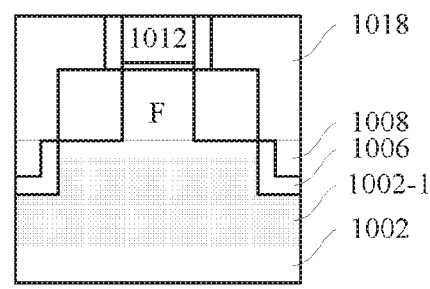

Next, as shown in FIG. 10, an inter-layer dielectric layer 1018 may be formed through, for example, deposition, on the structure illustrated in FIG. 9. The inter-layer dielectric layer 1018 may comprise oxide, for example. Then, the inter-layer dielectric layer 1018 is planarized by, for example, CMP, which may stop at the spacer 1014, thereby exposing the sacrificial gate conductor layer 1012. Then, the sacrificial gate conductor layer 1012 may be selectively removed by, for example, a TMAH solution, and the sacrificial gate dielectric layer 1010 may be further removed. In this way, a trench (not shown) is formed inside the spacer 1018.

Figure 11A:
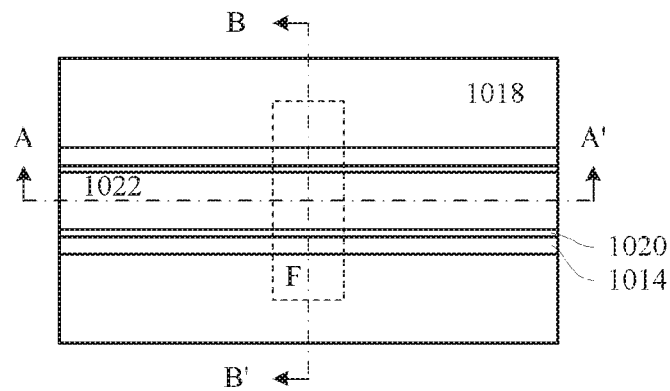
Figure 11B:
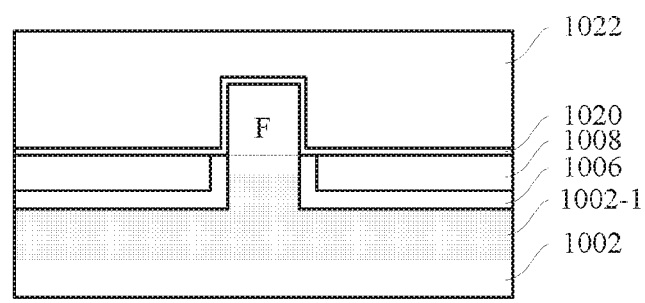
Figure 11C:
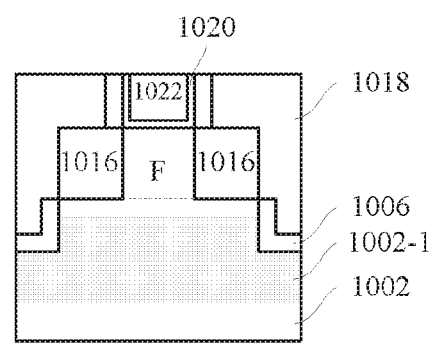

Subsequently, as shown in FIGS. 11(a)-11(c) (FIG. 11(b) shows a cross-sectional view along line AA' in FIG. 11(a), and FIG. 11(c) shows a cross-sectional view along line BB' in FIG. 11(a)), a final gate stack is formed by forming a gate dielectric layer 1020 and a gate conductor layer 1022 in the trench. The gate dielectric layer 1020 may comprise a high-K gate dielectric, such as HfO$_2$, with a thickness of about 1-5 nm. The gate conductor layer 1022 may comprise a metal gate conductor. Further, a work function adjustment layer (not shown) may be further formed between the gate dielectric layer 1020 and the gate conductor layer 1022.

As such, the semiconductor device according to the embodiment is achieved. As shown in FIGS. 11(a)-11(c), the semiconductor device comprises the fin structure F1 formed on the substrate 1002. As described above, the fin structure F1 is defined by the isolation layer 1008 as the fin F and the portion beneath the fin F. The charged PTS layer 1006 is formed on the side walls of the portion beneath the fin F. The gate stack (including the gate dielectric layer 1020 and the gate conductor layer 1022) is formed on the isolation layer 1008, and intersects the fin F. The semiconductor device further comprises the source/drain regions 1016 formed on opposite ends of the fin F.

In the above example, the PTS layer 1006 is in a single-layer structure. However, the present disclosure is not limited thereto, and a multi-layer structure is also possible. Some examples will be described below.

FIGS. 12-15 are views illustrating some steps in a flow of manufacturing a semiconductor device according to another embodiment of the present disclosure. In the following, differences from the above embodiment will be focused on.

Figure 12:
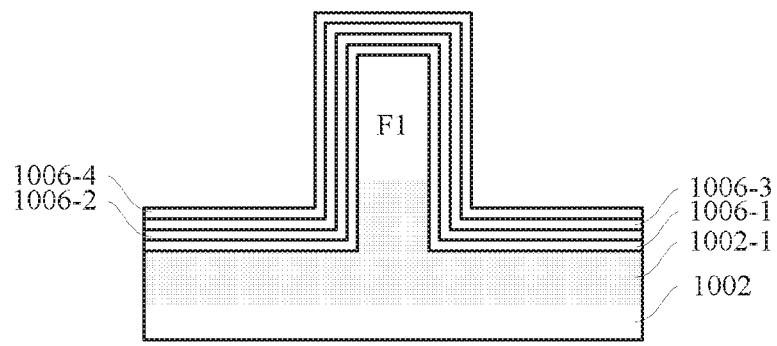
FIGS. 12-15 are views illustrating some steps in a flow of manufacturing a semiconductor device according to another embodiment of the present disclosure.

As shown in FIG. 12, a fin structure F1 is formed on a substrate 1002. Further, a well 1002-1 may be formed in the substrate 1002. For details thereof, reference may be made to the above descriptions in conjunction with FIGS. 1 and 2.

A first dielectric layer 1006-1, a charge trapping layer 1006-2, a second dielectric layer 1006-3 and a conductive layer 1006-4 may be formed in sequence through, for example, deposition, on the substrate 1002 with the fin structure F1 formed thereon. For example, the first dielectric layer 1006-1 may comprise oxide, oxynitride, or a high-K gate dielectric (such as HfO$_2$ and the like), with a thickness of about 0.5-5 nm; the charge trapping layer 1006-2 may comprise dielectric such as nitride, or a conductive layer such as doped polysilicon or a metal layer, with a thickness of about 1-5 nm; the second dielectric layer 1006-3 may comprise oxide, oxynitride, or a high-K gate dielectric (such as HfO$_2$ and the like), with a thickness of about 0.5-10 nm, and preferably, thicker than the first dielectric layer 1006-1; and the conductive layer 1006-4 may comprise doped polysilicon, metal such as W, metal nitride such as TiN or the like, with a thickness of about 1-5 nm.

Figure 13:
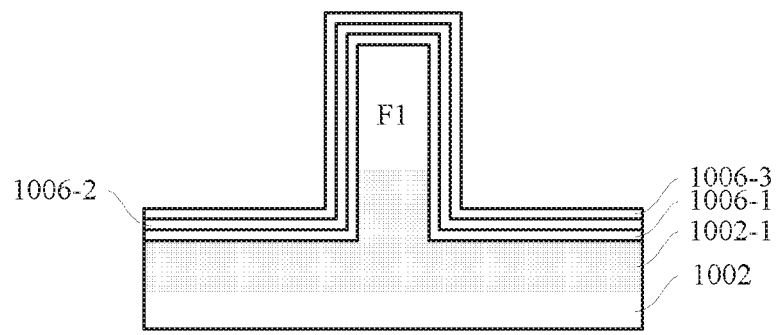

Then, a voltage may be applied between the conductive layer 1006-4 and the well 1002-1, to charge the charge trapping layer 1006-2, so that the charge trapping layer 1006-2 has charges trapped therein. For example, for an n-type device, a positive voltage may be applied to the conductive layer 1006-4 and a negative voltage may be applied to the well 1002-1 (for example, the applied voltage difference can enable the electrons in the well 1002-1 to tunnel through the first dielectric layer 1006-1, but is not enough to enable the electrons in the charge trapping layer 1006-2 to tunnel through the second dielectric layer 1006-3), so that the electrons in the well 1002-1 tunnel through the first dielectric layer 1006-1 to enter the charge trapping layer 1006-2 and are stored in the charge trapping layer 1006-2. In the charge trapping layer 1006-2, the net charges may have a dosage of about $10^{11}$-$10^{14}$ cm$^{-2}$. For a p-type device, a negative voltage may be applied to the conductive layer 1006-4 and a positive voltage may be applied to the well 1002-1 (for example, the applied voltage difference may enable the electrons in the charge trapping layer 1006-2 to tunnel through the first dielectric layer 1006-1, but is not enough to enable the electrons in the conductive layer 1006-4 to tunnel through the second dielectric layer 1006-3), so that the holes in the well 1002-1 or the electrons in the charge trapping layer 1006-2 tunnel through the first dielectric layer 1006-1, and thus net positive charges are generated in the charge trapping layer 1006-2 or the charge trapping layer 1006-2 is positively charged. In the charge trapping layer 1006-2, the net charges may have a dosage of about $10^{11}$-$10^{14}$ cm$^{-2}$. Next, as shown in FIG. 13, the conductive layer 1006-4 may be selectively removed.

In another embodiment, the charge trapping layer 1006-2 may be charged from the conductive layer 1006-4. In this embodiment, the second dielectric layer 1006-3 may be thinner than the first dielectric layer 1006-1. For example, the first dielectric layer 1006-1 has a thickness of about 0.5-10 nm, and the second dielectric layer 1006-3 has a thickness of about 0.5-5 nm.

A voltage may be applied between the conductive layer 1006-4 and the well 1002-1, to charge the charge trapping layer 1006-2, so that the charge trapping layer 1006-2 has charges trapped therein. For example, for an n-type device, a negative voltage may be applied to the conductive layer 1006-4 and a positive voltage may be applied to the well 1002-1 (for example, the applied voltage difference can enable the electrons in the conductive layer 1006-4 to tunnel through the second dielectric layer 1006-3, but is not enough to enable the electrons in the charge trapping layer 1006-2 to tunnel through the first dielectric layer 1006-1), so that the electrons in the conductive layer 1006-4 tunnel through the second dielectric layer 1006-3 to enter the charge trapping layer 1006-2, and are stored in the charge trapping layer 1006-2. In the charge trapping layer 1006-2, the net charges may have a dosage of about $10^{11}$-$10^{14}$cm$^{-2}$. For a p-type device, a positive voltage may be applied to the conductive layer 1006-4 and a negative voltage may be applied to the well 1002-1 (for example, the applied voltage difference may enable the electrons in the charge trapping layer 1006-2 to tunnel through the second dielectric layer 1006-3, but is not enough to enable the electrons in the well 1002-1 to tunnel through the first dielectric layer 1006-1), so that the electrons in the charge trapping layer 1006-2 tunnel through the second dielectric layer 1006-3, and thus net positive charges are generated in the charge trapping layer 1006-2 or the charge trapping layer 1006-2 is positively charged. In the charge trapping layer 1006-2, the net charges may have a dosage of about $10^{11}$-$10^{14}$ cm$^{-2}$.

Figure 14:
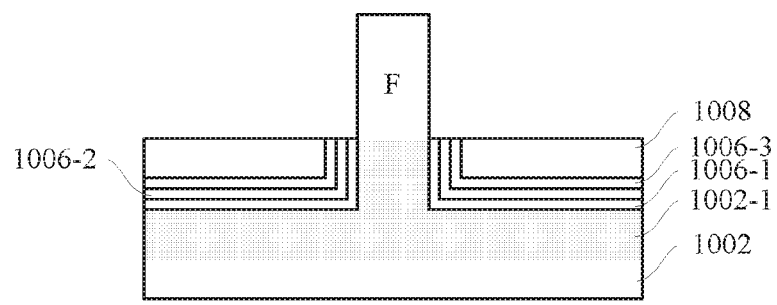
Figure 15:
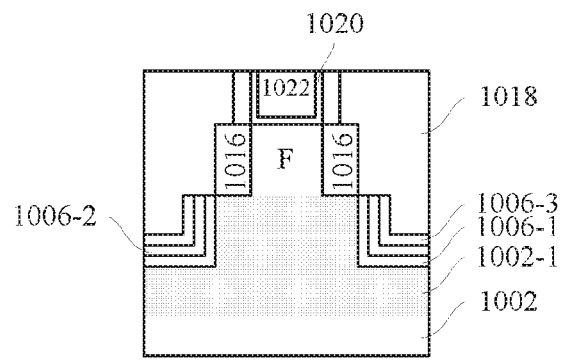

Subsequent processes may be the same as those in the above embodiment. For example, as shown in FIG. 14, an isolation layer 1008 may be formed, and portions of the first dielectric layer 1006-1, the charge trapping layer 1006-2 and the second dielectric layer 1006-3 which are exposed by the isolation layer 1008 may be selectively removed, as described above in conjunction with FIGS. 4 and 5. Next, the manufacturing process may proceed as in the above flow, resulting in the device illustrated in FIG. 15. In the device, the PTS layer comprises a stack of the first dielectric layer 1006-1, the charge trapping layer 1006-2, and the second dielectric layer 1006-3, wherein the charge trapping layer 1006-2 is charged, and the first dielectric layer 1006-1 and the second dielectric layer 1006-3 cause the charges in the charge trapping layer 1006-2 not mobile.

Figure 16:
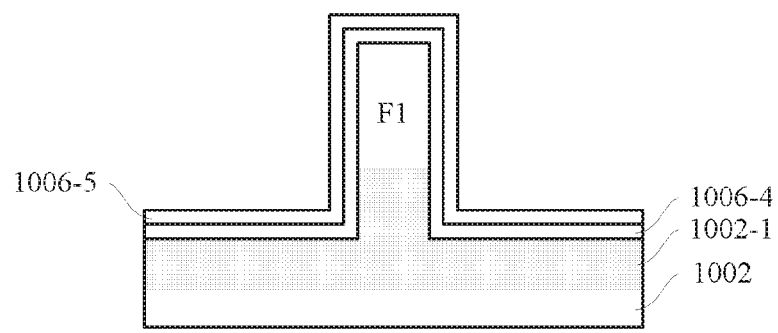
FIGS. 16-19 are views illustrating some steps in a flow of manufacturing a semiconductor device according to a further embodiment of the present disclosure.
Figure 17:
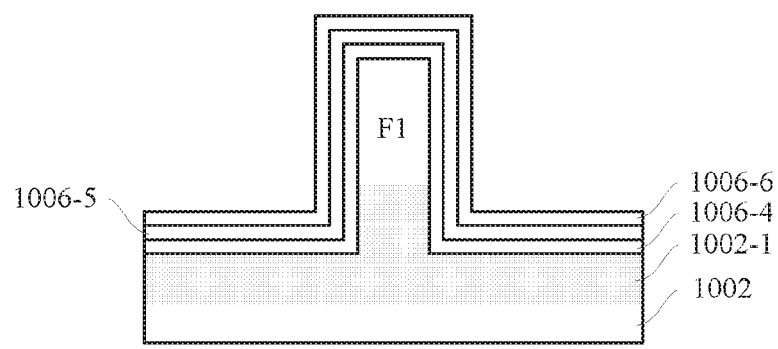
Figure 18:
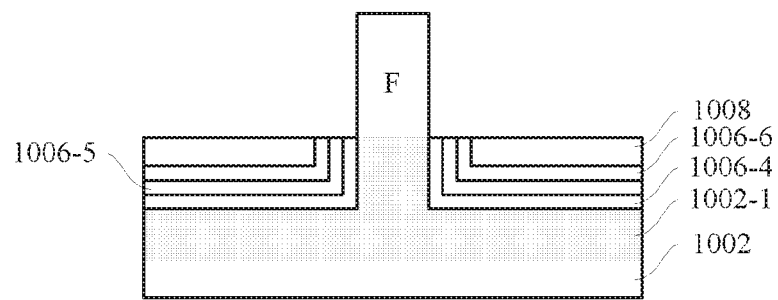
Figure 19:
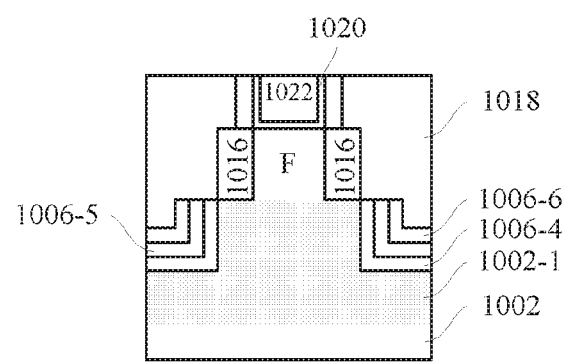

FIGS. 16-18 are views illustrating some steps in a flow of manufacturing a semiconductor device according to a further embodiment of the present disclosure. In the following, differences from the above embodiment will be focused on.

As shown in FIG. 16, a fin structure F1 is formed on a substrate 1002. Further, a well 1002-1 may be formed in the substrate 1002. For details thereof, reference may be made to the above descriptions in conjunction with FIGS. 1 and 2.

A first dielectric layer 1006-4 and a charge trapping layer 1006-5 may be formed in sequence through, for example, deposition, on the substrate 1002 with the fin structure F1 formed thereon. For example, the first dielectric layer 1006-4 may comprise oxide or oxynitride, with a thickness of about 0.5-5 nm; and the charge trapping layer 1006-5 may comprise dielectric such as nitride, or a conductive layer such as doped polysilicon or a metal layer, with a thickness of about 1-5 nm. The charge trapping layer 1006-5 may be charged by plasma treatment. If an n-type device is to be formed, the charge trapping layer 1006-5 may be negatively charged; or if a p-type device is to be formed, the charge trapping layer 1006-5 may be positively charged. In the charge trapping layer 1006-5, the charges may have a dosage of about $10^{11}$-$10^{14}$ cm$^{-2}$. Next, as shown in FIG. 17, a second dielectric layer 1006-6 may be formed through, for example, deposition, on the charged charge trapping layer 1006-5. For example, the second dielectric layer 1006-6 may comprise oxide or oxynitride, with a thickness of about 0.5-5 nm.

Subsequent processes may be the same as those in the above embodiment. For example, as shown in FIG. 17, an isolation layer 1008 may be formed, and portions of the first dielectric layer 1006-4, the charge trapping layer 1006-5 and the second dielectric layer 1006-6 which are exposed by the isolation layer 1008 may be selectively removed, as described above in conjunction with FIGS. 4 and 5. Next, the manufacturing process may proceed as in the above flow, resulting in the device illustrated in FIG. 18. In the device, the PTS layer comprises a stack of the first dielectric layer 1006-4, the charge trapping layer 1006-5, and the second dielectric layer 1006-6, wherein the charge trapping layer 1006-5 is charged, and the first dielectric layer 1006-4 and the second dielectric layer 1006-6 cause the charges in the charge trapping layer 1006-5 not mobile.

The transistors according to the embodiments of the present disclosure are applicable to various electronic devices. For example, an Integrated Circuit (IC) may be formed by integrating a plurality of such transistors and other devices (for example, transistors in other forms or the like), from which an electronic device may be made. Therefore, the present disclosure further provides an electronic device comprising the above transistor. The electronic device may also comprise components such as a display operatively coupled to the transistor and a wireless transceiver operatively coupled to the transistor, or the like. Such an electronic device may comprise, for example, a smart phone, a tablet Personal Computer (PC), a Personal Digital Assistant (PDA), or the like.

According to an embodiment of the present disclosure, there is also provided a method of manufacturing a System on Chip (SoC). The method may comprise the above method of manufacturing the transistor. In particular, a number of various devices may be integrated on a chip, and at least some of the devices are manufactured by the method according to the present disclosure.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

The present disclosure is described above with reference to the embodiments thereof. However, those embodiments are provided only for illustrative purpose, rather than limiting the present disclosure. The scope of the disclosure is defined by the attached claims as well as equivalents thereof. Those skilled in the art can make various alternations and modifications without departing from the scope of the disclosure, which all fall within the scope of the disclosure.

We claim:
1. An n-type semiconductor device, comprising:
a fin structure formed on a substrate;
an isolation layer formed on the substrate, wherein a portion of the fin structure above the isolation layer acts as a fin of the semiconductor device;
a charged punch-through stopper (PTS) layer formed on side walls of a portion of the fin structure beneath the fin; and
a gate stack formed on the isolation layer and intersecting the fin,
wherein the PTS layer comprises a stack of a first dielectric layer, a charge trapping layer, and a second dielec- tric layer in sequence from the side walls, wherein the charge trapping layer has net negative charges that are not mobile, wherein the first dielectric layer comprises oxide, oxynitride, or a high-K gate dielectric, wherein the charge trapping layer comprises a nitride, a doped polysilicon, or a metal layer, and wherein the second dielectric layer comprises oxide, oxynitride, or a high-K gate dielectric.

2. The semiconductor device according to claim 1, wherein the PTS layer is an insulator.

3. The semiconductor device according to claim 1, further comprising:
a well formed in the substrate, wherein the well has a top surface lower than the bottom of the fin by a distance.

4. The semiconductor device according to claim 1, wherein the PTS layer has a portion extending on the side walls of the fin structure and a portion extending along a surface of the substrate.

5. The semiconductor device according to claim 1, further comprising:
source/drain regions formed on opposite ends of the fin, wherein the source/drain regions comprise a different semiconductor material from that of the fin.

6. The semiconductor device according to claim 1 wherein the net charges in the PTS layer have a dosage of about $10^{11}$-$10^{14}$ cm$^{-2}$.

7. A p-type semiconductor device, comprising:
a fin structure formed on a substrate;
an isolation layer formed on the substrate, wherein a portion of the fin structure above the isolation layer acts as a fin of the semiconductor device;
a charged punch-through stopper layer (PTS) formed on side walls of a portion of the fin structure beneath the fin; and
a gate stack formed on the isolation layer and intersecting the fin,
wherein the PTS layer comprises a stack of a first dielectric layer, a charge trapping layer, and a second dielectric layer in sequence from the side walls, wherein the charge trapping layer has net positive charges that are not mobile,
wherein the first dielectric layer comprises oxide, oxynitride, or a high-K gate dielectric, wherein the charge trapping layer comprises a nitride, a doped polysilicon, or a metal layer, and wherein the second dielectric layer comprises oxide, oxynitride, or a high-K gate dielectric.

8. The semiconductor device according to claim 7, wherein the PTS layer is an insulator.

9. The semiconductor device according to claim 7, further comprising:
a well formed in the substrate, wherein the well has a top surface lower than the bottom of the fin by a distance.

10. The semiconductor device according to claim 7, wherein the PTS layer has a portion extending on the side walls of the fin structure and a portion extending along a surface of the substrate.

11. The semiconductor device according to claim 7, further comprising:
source/drain regions formed on opposite ends of the fin, wherein the source/drain regions comprise a different semiconductor material from that of the fin.

12. The semiconductor device according to claim 7, wherein the net charges in the PTS layer have a dosage of about $10^{11}$-$10^{14}$ cm$^{-2}$.

13. An electronic device, comprising an integrated circuit formed from the semiconductor device according to claim 1.

14. The electronic device according to claim 13, further comprising:
a display operatively coupled to the integrated circuit and a wireless transceiver operatively coupled to the integrated circuit.

* * * * *